United States Patent
Kondo (10) Patent No.: US 7,154,423 B2
(45) Date of Patent: Dec. 26, 2006

(54) SUCCESSIVE APPROXIMATION A/D CONVERTER COMPARING ANALOG INPUT VOLTAGE TO REFERENCE VOLTAGES AND A COMPARATOR FOR USE THEREIN

(75) Inventor: Mamoru Kondo, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 79 days.

(21) Appl. No.: 11/033,377

(22) Filed: Jan. 12, 2005

(65) Prior Publication Data

US 2005/0146456 A1   Jul. 7, 2005

(30) Foreign Application Priority Data

Apr. 1, 2004   (JP)   ............... 2004-109077

(51) Int. Cl.
*H03M 1/00*   (2006.01)
(52) U.S. Cl. .................... 341/136; 341/155
(58) Field of Classification Search ........... 341/136, 341/163, 172; 327/64
See application file for complete search history.

(56) References Cited

U.S. PATENT DOCUMENTS

| | | | | |
|---|---|---|---|---|
| 4,197,472 A | * | 4/1980 | Aoki et al. | 327/64 |
| 4,211,942 A | * | 7/1980 | Aoki et al. | 327/64 |
| 4,323,887 A | * | 4/1982 | Buurma | 341/136 |
| 4,348,658 A | * | 9/1982 | Carter | 341/136 |
| 4,641,130 A | * | 2/1987 | Mastroianni | 341/136 |
| 5,247,299 A | * | 9/1993 | Lim et al. | 341/136 |
| 5,260,705 A | * | 11/1993 | Inukai | 341/155 |
| 5,539,695 A | * | 7/1996 | Saito et al. | 365/189.09 |
| 5,570,091 A | * | 10/1996 | Noro et al. | 341/161 |
| 5,576,708 A | * | 11/1996 | De Wit | 341/118 |
| 6,020,841 A | * | 2/2000 | Susak | 341/163 |
| 6,054,945 A | * | 4/2000 | Doyle | 341/150 |
| 6,340,942 B1 | * | 1/2002 | Zhou et al. | 341/158 |
| 6,714,151 B1 | * | 3/2004 | Tachibana et al. | 341/155 |
| 6,950,052 B1 | * | 9/2005 | Leung | 341/172 |

FOREIGN PATENT DOCUMENTS

JP   08-195655   7/1996

* cited by examiner

*Primary Examiner*—Jean Bruner Jeanglaude
(74) *Attorney, Agent, or Firm*—Nixon Peabody LLP; Donald R. Studebaker (57) ABSTRACT

A successive approximation type of analog-to-digital converter fabricated in a MOS type semiconductor integrated circuit includes a comparison voltage generator for generating a comparison voltage to be compared with an analog signal voltage, a comparator for sequentially comparing the comparison voltage with the analog signal voltage to produce a comparison result, and a comparison result processor for developing the comparison result to an output register connected to a bus and feeding the comparison voltage generator with a comparison voltage value determined according to the comparison result. The comparator includes two sets of P-channel transistors connected in serial. In each set, one transistor is connected in parallel to, and larger in driving capacity than, the other transistor. The one transistor is controlled in switching timing different from the other transistor.

12 Claims, 7 Drawing Sheets

SUCCESSIVE APPROXIMATION A/D CONVERTER COMPARING ANALOG INPUT VOLTAGE TO REFERENCE VOLTAGES AND A COMPARATOR FOR USE THEREIN

BACKGROUND OF THE INVENTION

1. Field of the Invention

The present invention relates to a successive approximation type of analog-to-digital (A/D) converter, and more particularly to, for example, a successive approximation type of analog-to-digital converter formed in a MOS (Metal-Oxide-Semiconductor) type of semiconductor integrated circuit, and a comparator for use therein.

2. Description of the Background

Analog-to-digital conversion circuits for converting analog signals into corresponding digital signals, or A/D converters, are classified into an integration system and a comparison system. As the comparison system, there have been known kinds of conversion system, such as a parallel comparison type and a successive approximation type. The successive approximation type of analog-to-digital conversion circuit is adapted, for example, for comparing an input analog voltage to be converted with a plurality of reference voltages in sequence from the MSB (Most Significant Bit) position toward the LSB (Least Significant Bit) position to thereby determine each bit value.

The successive approximation type of analog-to-digital conversion circuit is composed, for example, of a comparator for comparing an input voltage with comparison voltages, a comparison register for generating and determining a resultant voltage value from the comparison made by the comparator, and a digital-to-analog (D/A) conversion circuit for converting the resultant voltage value into a corresponding analog value.

Such a comparator for performing voltage comparison is disclosed, for example, by Japanese patent laid-open publication No. 195655/1996, in which a chopper type voltage comparator is protected from an error caused by noise.

In a successive approximation type of analog-to-digital converter, switches are provided in its digital-to-analog conversion circuit and voltage comparator such as to be turned on and off to compare the voltage of each bit. The switches are implemented by analog switches formed into CMOS (Complementary MOS) semiconductor circuits including NMOS, PMOS, N type and P type semiconductor devices. The analog switches are adapted to be turned on and off in response to voltage fed to the gate electrode of the transistors thereof. When the gate voltage varies, the parasitic capacitance of the transistors varies accordingly to cause switching noise to be generated. This switching noise worsens the accuracy of the digital-to-analog and analog-to-digital converters, as was a problem.

Further, in the voltage comparator, when an analog input voltage is sampled and held, corresponding electric charges are stored in its internal capacitors. In order to increase the rate of the sampling and holding, MOS transistors of a larger size have to be prepared for the analog switches. However, when the size of the MOS transistor is increased, switching noise becomes larger in proportion to its size to worsen the accuracy in analog-to-digital conversion, which has also been a problem.

Moreover, in order to heighten the accuracy in sequential analog-to-digital conversions, it is necessary to increase the specific accuracy of the capacitors for holding an analog input voltage. In that case, there is a limit in downsizing of the capacitors. Also, when the analog-to-digital converter is designed to store electric charges of a minute voltage level establishing its higher accuracy in resolution with its appropriate operating speed maintained, there has been a limit in the size reduction of the MOS transistors implementing the switches.

SUMMARY OF THE INVENTION

It is therefore an object of the present invention to provide a successive approximation type of analog-to-digital converter of high accuracy with switching noise controlled.

It is also an object of the invention to provide a comparator arranged in the successive approximation type of analog-to-digital converter and the like of high accuracy with switching noise controlled.

A successive approximation type of analog-to-digital converter comprises a comparator for sequentially comparing an analog input voltage with a comparison voltage to generate a comparison result. The comparator comprises: a first inverter for receiving the analog input voltage and the comparison voltage in sequence; a capacitor having one plate connected to the first inverter to store an electric charge; a second inverter connected to another plate of the capacitor; a first feedback switch connected in parallel to an input and an output terminal of the first inverter; and a second feedback switch connected in parallel to an input and an output terminal of the second inverter. The first feedback switch includes first and second transistors connected in parallel to each other to the input and output terminals of the first inverter, the first transistor being formed to have a driving capacity larger than that of the second transistor. The second feedback switch includes third and fourth transistors connected in parallel to each other to the input and output terminals of the second inverter, the third transistor being formed to have a driving capacity larger than that of the fourth transistor. The first and third transistors have respective gate electrodes connected to each other and further connected to a first control input terminal for receiving a first control signal. The second and fourth transistors have respective gate electrodes connected to each other and further connected to a second control input terminal for receiving a second control signal. In successive approximation operation, the first and third transistors are controlled differently in timing of switching between conductive and non-conductive states from the second and fourth transistors to compare the analog input voltage with the comparison voltage.

Also, in view of solving the problems described above, in a successive approximation type of analog-to-digital converter comprising a comparator for sequentially comparing an analog input voltage with a comparison voltage to generate a comparison result, the comparator comprises: a first inverter for receiving the analog input voltage and the comparison voltage in sequence; a capacitor having one plate connected to the first inverter to store an electric charge; a second inverter connected to another plate of the capacitor; a first feedback switch connected in parallel to an input and an output terminal of the first inverter; and a second feedback switch connected in parallel to an input and an output terminal of the second inverter. The first feedback switch includes first and second transistors connected in parallel to each other to the input and output terminals of the first inverter, the first transistor being formed to have a driving capacity larger than that of the second transistor. The second feedback switch includes third and fourth transistors connected in parallel to each other to the input and output terminals of the second inverter, the third transistor being formed to have a driving capacity larger than that of the fourth transistor. The first transistor has a gate electrodes connected to a first control input terminal for receiving a first control signal, and the third transistor has a gate electrode connected to a second control input terminal for receiving a second control signal. The second and fourth transistors have respective gate electrodes connected to each other and further connected to a third control input terminal for receiving a third control signal. In successive approximation operation, the first and third transistors are controlled differently in timing of switching between conductive and non-conductive states from the second and fourth transistors, and further the first and second transistors are controlled differently in timing of switching between conductive and non-conductive states from each other, to compare the analog input voltage with the comparison voltage.

Further, in view of solving the problems described above, a comparator for sequentially comparing an analog input voltage with a comparison voltage comprises: a first inverter for receiving the analog input voltage and the comparison voltage in sequence; a capacitor having one plate connected to an output terminal of the first inverter to store an electric charge; a second inverter connected to another plate of the capacitor; a first feedback switch connected in parallel to an input and an output terminal of the first inverter; and a second feedback switch connected in parallel to an input and an output terminal of the second inverter. The first feedback switch includes first and second transistors connected in parallel to each other to the input and output terminals of the first inverter, the first transistor being formed to have a driving capacity larger than that of the second transistor. The second feedback switch includes third and fourth transistors connected in parallel to each other to the input and output terminals of the second inverter, the third transistor being formed to have a driving capacity larger than that of the fourth transistor. The first and third transistors have respective gate electrodes connected to each other and further connected to a first control input terminal for receiving a first control signal, and the second and fourth transistors have respective gate electrodes connected to each other and further connected to a second control input terminal for receiving a second control signal. In successive approximation operation, the first and third transistors are controlled differently in timing of switching between conductive and non-conductive states from the second and fourth transistors to compare the analog input voltage with the comparison voltage.

Still further, in view of solving the problems described above, a comparator for sequentially comparing an analog input voltage with a comparison voltage comprises: a first inverter for receiving the analog input voltage and the comparison in sequence; a capacitor having one plate connected to an output terminal of the first inverter to store an electric charge; a second inverter connected to another plate of the capacitor; a first feedback switch connected in parallel to an input and an output terminal of the first inverter; and a second feedback switch connected in parallel to an input and an output terminal of the second inverter. The first feedback switch includes first and second transistors connected in parallel to each other to the input and output terminals of the first inverter, the first transistor being formed to have a driving capacity larger than that of the second transistor, The second feedback switch includes third and fourth transistors connected in parallel to each other to the input and output terminals of the second inverter, the third transistor being formed to have a driving capacity larger than that of the fourth transistor. The first transistor has a gate electrode connected to a first control input terminal for receiving a first control signal, and the third transistor has a gate electrode connected to a second control input terminal for receiving a second control signal. The second and fourth transistors have respective gate electrodes connected to each other and further connected to a third control input terminal for receiving a third control signal. In successive approximation operation, the first and third transistors are controlled differently in timing of switching between conductive and non-conductive states from the second and fourth transistors, and further the first and second transistors are controlled differently in timing of switching between conductive and non-conductive states from each other, to compare the analog input voltage with the comparison voltage.

According to the present invention, when successive approximation operation is performed, the first and third transistors having larger driving capacity are controlled differently in on and off switching timing from the second and fourth transistor having smaller driving capacity. Accordingly, the first and second transistors are turned off, and thereafter the second and fourth transistors are turned off. More accurate comparison of the analog voltage can be achieved free from an offset error with the effect of switching noise controlled. By means of the first and third transistors having larger driving capacity, electric charges of the input voltage can be stored in a sample and hold capacitor at a higher speed.

Further, a transistor connected in parallel to the first inverter of the comparator is controlled to be turned off first, and a transistor connected in parallel to the second inverter thereof is then controlled to be turned off. That prevents a temporary increase of the offset which would otherwise be caused by simultaneous switching.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

In the following, with reference to the accompanying drawings, embodiments of a comparison voltage generating circuit and a comparator built in a successive approximation type of analog-to-digital (A/D) converter will be described in detail, to which the present invention is applied. To begin with, referring to FIG. 2, the schematic configuration of a successive approximation type of analog-to-digital converter 200 is implemented in the form of CMOS LSI (Large-Scale Integration). The embodiment of the successive approximation type of analog-to-digital converter 200 includes a comparison voltage generating circuit 210 for generating comparison voltages to compare the voltage of an analog input signal AIN received on its analog input port 202. In the specification, signals are designated with reference numerals designating connections on which they are conveyed. The analog-to-digital converter 200 further includes a comparator 220 connected to an output 212 of the comparison voltage generator 210 to compare the comparison voltages delivered from the output 212 with the input analog signal voltage in sequence to then produce the resultant output 222 from the comparison.

Figure 2:
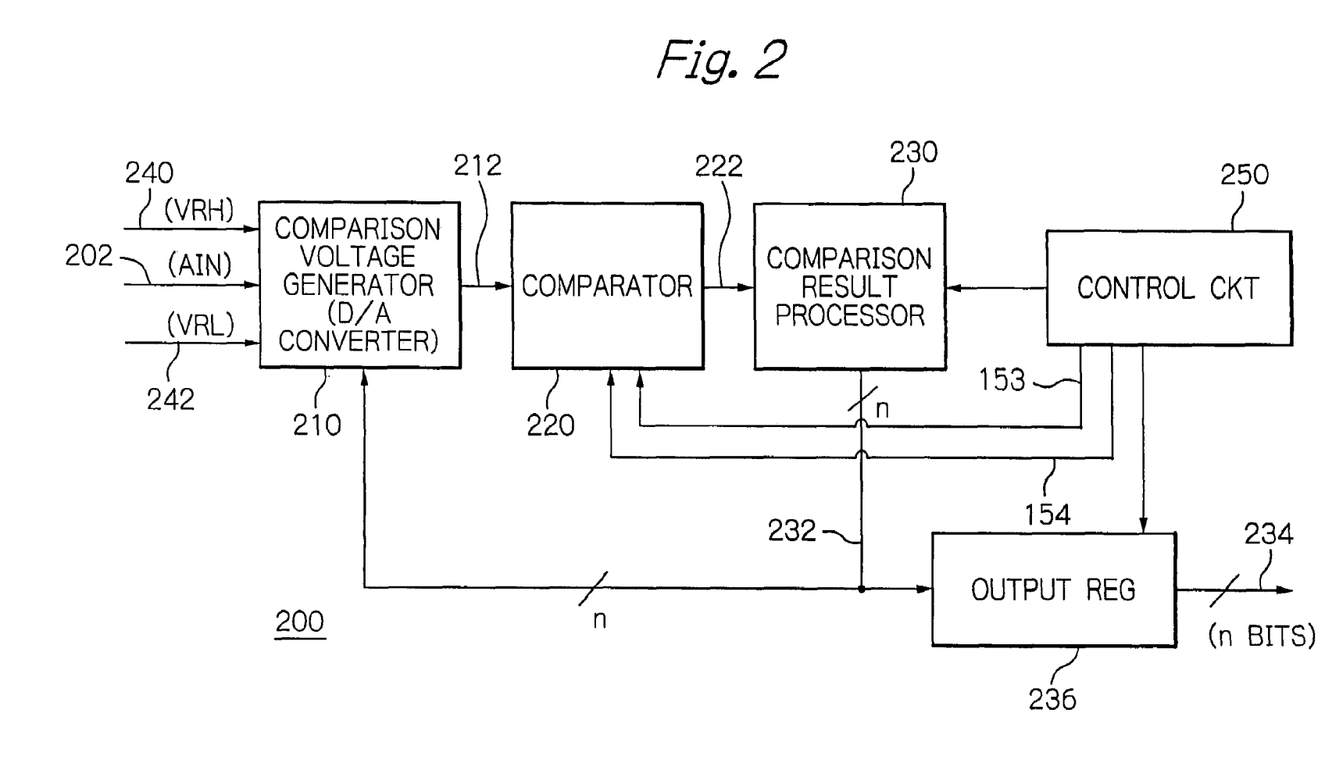
FIG. 2 is a schematic block diagram showing an embodiment of a successive approximation type of analog-to-digital converter in accordance with the invention.

The comparator 220 has its output 222 connected to a comparison result processing circuit 230. The comparison result processor 230 is adapted to transfer the comparison result received from the comparator 220 to an n-bit bus 232 having n parallel bit lines to then feed it to an output register 236, where n is a positive integer. The n-bit bus 232 is also connected to the comparison voltage generator 210 to convey a control signal for controlling n switches 107, 109, ..., 111, 113 and 115 provided in the comparison voltage generator 210, as described later. The control signal 232 is formed by the bi-state signals, each of which appears on one of the n lines of the bus 232. The control signal 232 takes in its entirety a digital value representing a comparison voltage which is determined according to the result from the comparison made on the immediately more significant bit than a bit to be currently compared.

The comparison result processor 230 includes a comparison register, not shown, adapted for temporarily holding the thus generated control signal and feeding the held control signal to the comparison voltage generator 210 over the bus 232. The output register 236 is a storage circuit which is connected to the bus 232 to hold the values of those bits sequentially coming therein and converts, when all the bit values of the MSB through LSB positions have been stored therein, the values thus held into n bits of digital signal on its output 234. In the description thereafter, portions not directly relevant to understanding the invention will be omitted from the drawings and description for simplicity.

The comparison voltage generator 210 has its one input terminal 240 fed with a full-scale reference voltage VRH and its other input terminal 242 fed with a zero-scale reference voltage VRL. The control circuit 250 has its outputs 153 and 154 connected to the comparator 220 to produce the control signals 153 and 154 to control the comparator 220.

Figure 1:
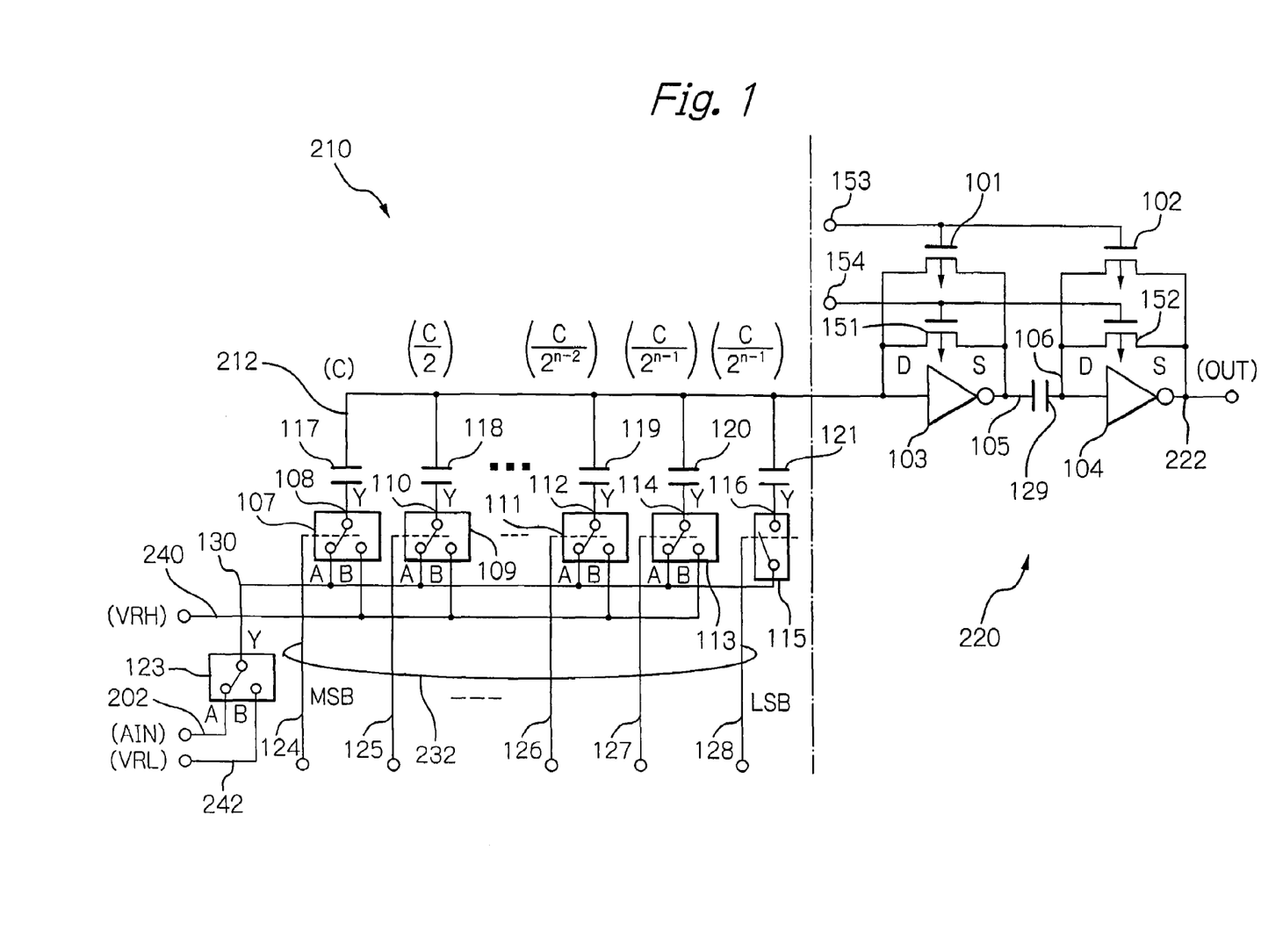
FIG. 1 is a schematic circuit diagram showing an embodiment of a comparison voltage generating circuit and a comparator built in a successive approximation type of analog-to-digital converter.

Internal configuration of the comparison voltage generator 210 and the comparator 220 are shown in FIG. 1. In the figure, the comparison voltage generator 210 is shown on the left and the comparator 220 on the right. The comparison voltage generator 210 in the embodiment comprises a plurality n of switches 107, 109, ..., 111, 113 and 115 for sampling and holding the input analog signal AIN and the corresponding plurality n of capacitors 117, 118, ..., 119, 120 and 121 connected to the plurality of switches 107, 109, ..., 111, 113 and 115, respectively, to form a capacitance-ladder (C-ladder) type of digital-to-analog converter weighted with capacitance.

The switch 123 has its one input terminal A connected to the analog input (AIN) 202 to the comparison voltage generator 210, and its other input terminal B connected to the input terminal 242, to which applied is the zero-scale reference voltage VRL. The switch 123 has its output terminal Y connected in common through a node 130 to one input terminal A of the switches 107, 109, ..., 111 and 113, which have other input terminals B thereof interconnected to an input terminal 240, to which applied is the full-scale reference voltage VRH. The node 130 is also connected to the input terminal of the switch 115. The switches 107, 109, ..., 111, 113 and 115 have output terminals Y thereof interconnected to one plate of capacitors 117, 118, ..., 119, 120 and 121, respectively, which are arranged correspondingly to the switches 107, 109, 111, ..., 113 and 115.

Now, assuming that the n capacitors 117, 118, ..., 119, 120 and 121 have, respectively, capacitances C, C/2, C/2$^{(n-2)}$, C/2$^{(n-1)}$ and C/2$^{(n-1)}$, between the capacitors 118 and 119, there are arranged capacitors having the capacitances of C/2$^2$, ..., C/2$^{(n-3)}$, respectively, connected to switches not specifically shown in the figure. Again, it is confirmed that the number "n" is representative of the connection stages of the capacitors 117–121, including capacitors not shown in the figure.

The switches 107, 109, ..., 111, 113 and 115 have control terminals 124–128, respectively, connected for receiving the control signal carried over the n-bit bus 232. The switches 107, 109, ..., 111 and 113 are changeover switches, which are adapted for selectively connecting any of the respective capacitors 117, 118, ..., 119 and 120 to the switch 123 while the remaining switches are connected to the input terminal 240, in response to the control signals 124–127. In other words, the switches 107, 109, ..., 111 and 113 are changeover switches for alternatively selecting the input terminal A or B to the output terminal Y to be connected to the respective capacitors 117–120 in response to the respective control signals 124–127. The switch 115 is adapted to be turned on in response to the control signal 128 to connect it to the output terminal Y. Each of the capacitors 117, 118, ..., 119, 120 and 121 has it other plate connected in common to a node 212.

The node 212 forms an output of the comparison voltage generator 210 and is connected to the comparator 220. The comparator 220 is a chopper comparator circuit adapted for comparing the input signals appearing on the input 212 in sequence to produce a resultant signal representative of the comparison result on the output terminal 222.

More specifically, the comparator 220 includes an inverter 103 on the first stage having its input connected to the output node 212 of the comparison voltage generator 210, and the P-channel type of transistors 101 and 151 which have drain electrodes thereof connected to the output node 212. The inverter 103 has its output port 105 interconnected to the source electrode of the P-channel transistor 101 and 151 and to one plate of the capacitor 129. The capacitor 129 has its other plate connected to the input of an inverter 104 on the second stage. The inverters 103 and 104 are adapted to invert the respective inputs with respect to the threshold voltage Vinvt to output respective, resultant inverted signals. The inverter 104 has its input also interconnected to the drain electrode of the P-channel transistors 102 and 152, while the inverter 104 has its output port interconnected to the source electrode of the P-channel transistors 102 and 152. By means of such a capacitive coupling, the capacitor 129 can cancel a difference in threshold voltage, i.e. offset voltage difference, between the inverters 103 and 104. In that way, the P-channel transistors 101 and 105 are connected in parallel to the output terminal of the inverter 103 to form an inverter feedback switch, and the P-channel transistors 102 and 152 are connected in parallel to the input-output terminal of the inverter 104 to form another inverter feedback switch. The output signal OUT on the inverter 104 forms the output 222 of the comparator 220.

Figure 5:
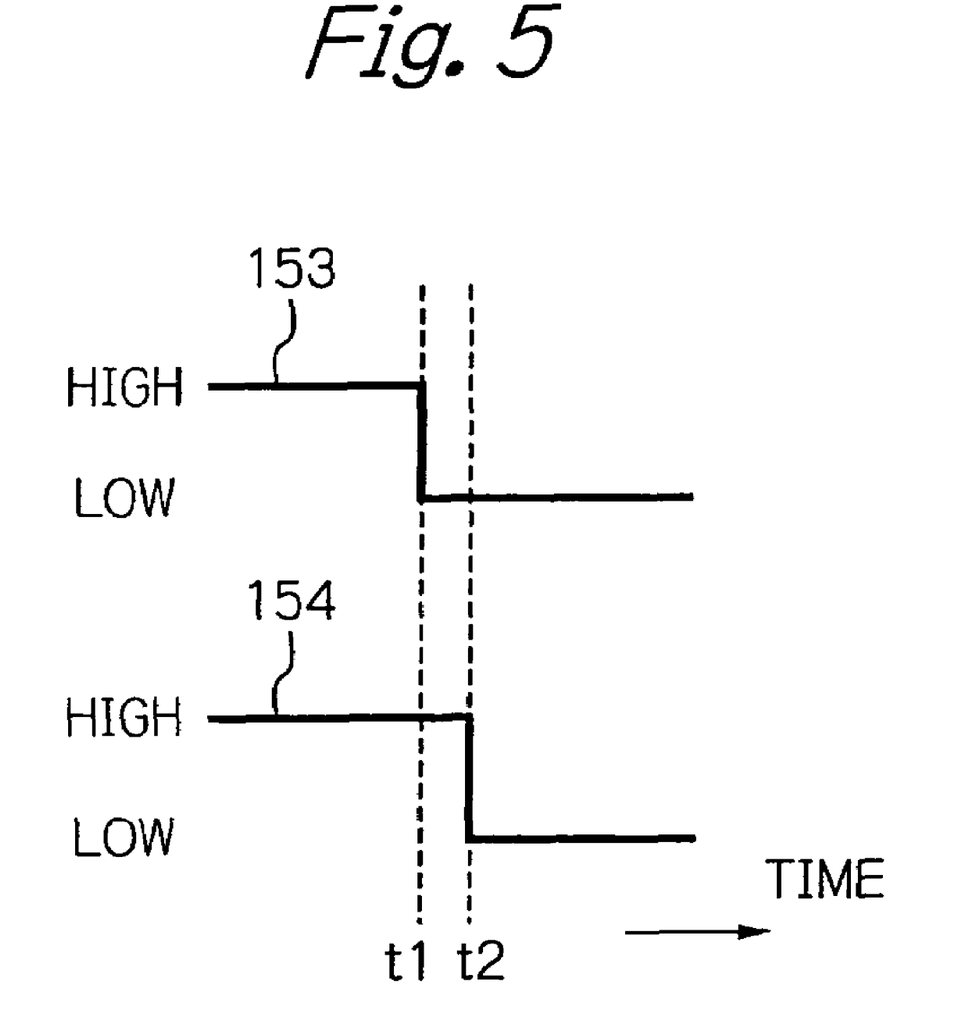
FIG. 5 is a timing chart showing timing waveforms of control signals fed into the comparator shown in FIG. 1.

The P-channel transistors 101 and 102 have the gate electrode thereof connected to the one control input terminal 153, while the P-channel transistors 151 and 152 have the gate electrode connected to the other control input terminal 154. Examples of the timing waveforms of the control signals delivered into the control input terminals 153 and 154 are shown in FIG. 5. As shown in the figure, the control signal 153 becomes its low level from its high level at time t2, and behind that the control signal 154 changes from its high level to its low level at time t2. The P-channel transistors 101 and 102, 151 and 152 are switched between he conductive and non-conductive states thereof in response to the control signals 153 and 154.

The relationship of the size among those P-channel transistors is set in such a fashion that the P-channel transistor 101 is larger than the P-channel transistor 151, and the P-channel transistor 102 is larger than the P-channel transistor 152. The relationship of the size among those transistors is directed to the comparison in size among those transistors in terms of the ratio (W/L ratio) of the gate width (W) to the gate length (L) of the gate electrode, and therefore corresponds to the driving capacity of those transistors. Accordingly, the capability of a transistor corresponding to the W/L ratio is referred to as the driving capacity. Dependently upon the driving capacity, for example, the speed of the positive and negative going varies at the time when a transistor is turned on and off, respectively. In addition, for those transistors different in characteristics, for example, the ratio of "4:1" to "6:1" may be applied to their driving capacity. In other words, the P-channel transistor 101 is designed to have its driving capacity four times to sixteen times as large as the P-channel transistors 151, and the P-channel transistor 102 is formed to have its driving capacity four times to sixteen times as large as the P-channel transistor 152.

Figure 3:
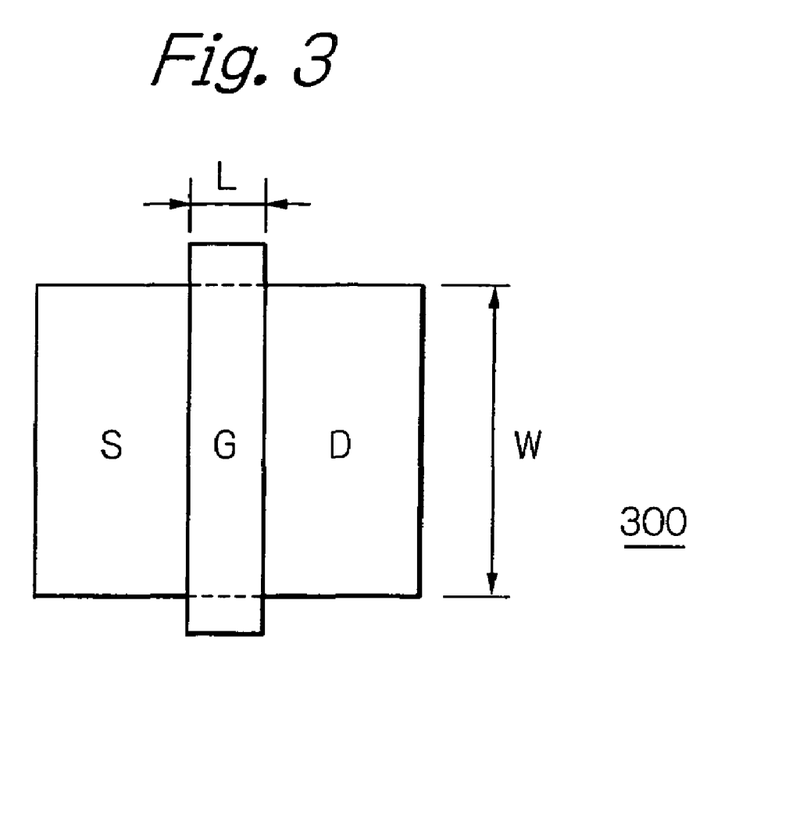
FIG. 3 is a schematic plan view exmeplarily showing a transistor having a larger driving capacity.
Figure 4:
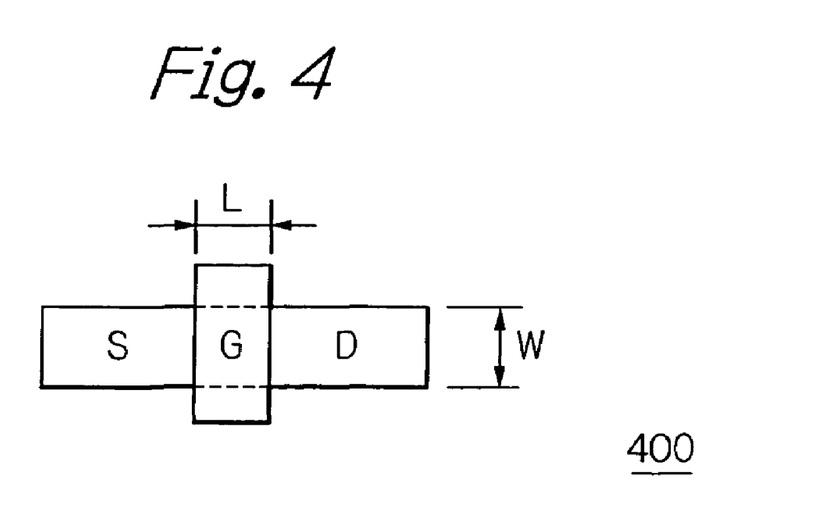
FIG. 4 is a schematic plan view, like FIG. 3, exmeplarily showing a transistor having a smaller driving capacity.

FIGS. 3 and 4 show schematic structures of the P-channel transistors. FIG. 3 shows a P-channel transistor 300 having a larger width W of the gate electrode G, while FIG. 4 shows a P-channel transistor 400 having a smaller width W of the gate electrode G. Assuming that those P-channel transistors 300 and 400 have the length L of the gate electrode G equal to each other, the structure of those transistors causes the P-channel transistor 300 to be larger in driving capacity, or W/L ratio, than the P-channel transistor 400.

Going back to FIG. 2, the comparison result processor 230 delivers the comparison result received from the comparator 220 to the n-bit bus 232 to supply it to the output resistor 236. The output register 236 is a storage circuit connected to the bus 232 and including a CMOS logic circuit for holding values of the bits coming sequentially at predetermined timings, and for converting, when all the bit values from its MSB to LSB positions have been stored therein, the values thus stored into an n-bit digital signal to develop the latter on its output 234. The output register 236 does not take in the bit values at the timing when the comparison result processor 230 produces the control signal 232, but only the determined value of the respective bits to keep on holding them. The system may be adapted to control those timings by, for example, the control circuit 250 or the processor 230.

Further, the comparison result processor 230 generates the control signals 124–128 and feeds the control signals to the comparison voltage generator 210 over the bus 232 at a predetermined timing to drive the switches 107, 109, . . . , 111, 113 and 115 of the comparison voltage generator 210 to switch them. More specifically, the comparison result processor 230, when the voltage of the input analog signal AIN is higher than the current comparison voltage, generates a control signal setting a new comparison voltage which is substantially equal to the current comparison voltage plus the voltage corresponding to the 1/n scale for use in the successive comparison of the immediately less significant bit. In that case, the comparison is controlled in such a way that one of the switches 107, 109, . . . , 111, 113 and 115 associated with the current bit under comparison is maintained at its conductive and another one of the switches 107, 109, . . . , 111, 113 and 115 associated with the immediately less significant bit is switched to its conductive state. On the contrary, when the voltage of the input analog signal is lower than the current comparison voltage, a control signal is generated which sets a new comparison voltage substantially equal to the current comparison voltage minus the voltage corresponding to the 1/n scale for use in the successive comparison of the immediately less significant bit. In the latter case, the comparison is controlled in such a way that one of the switches 107, 109, . . . , 111, 113 and 115 associated with the current bit under comparison is returned to its non-conductive and another one of the switches 107, 109, . . . , 111, 113 and 115 associated with the immediately less significant bit is switched to its conductive state. In this way, the comparison result processor 230 controls the switches 107–115 according to the comparison result to control the production of the comparison voltages for use in determining all the bit values from MSB to LSB positions.

The control circuit 250 has the timing control function of controlling the processing timing in the respective sections of the circuitry. For example, the control signals 153 and 154 are generated and supplied for controlling the comparator 220. In the embodiment, the control circuit 250 generates the control signal 153 for simultaneously turning the P-channel transistors 101 and 102 and 151 and 152, FIG. 1, to the conductive state thereof to cause the capacitor 129 to rapidly store the electric charges, and then turning the P-channel transistors 101 and 102 off first as shown in FIG. 5. Thereafter, the control circuit 250 further generates the control signal 154 for turning the P-channel transistors 151 and 152 off.

In this way, the plurality of transistors different in characteristics are controlled to operate at the different timing thereof to cause the initial non-conductive state of the P-channel transistors 101 and 102 to maintain the P-channel transistors 151 and 152 at the conductive state thereof, so that the offset of the electric charges due to switching noise can be compensated for. When the P-channel transistors 151 and 152 are turned off next, the transistor switches can be turned off with switching noise suppressed to its minimum level, since those transistors are structured to have the driving capacity smaller that of the other transistors connected in parallel thereto. Thereby, the inverters 103 and 104 and the capacitor 129, when a change occurs in the potential of the node 212, act as a comparator to produce the signal OUT of its high or low level on the output 222.

The operation will be described of the embodiment of the comparison voltage generator 210 and the comparator 220 built in the successive approximation type of analog-todigital converter 200. When the analog input AIN takes its analog input voltage, Vain, the changeover switch 123 and the changeover switches 107, 109, . . . , 111 and 113 are connected to the terminal A thereof, and the switch 115 is also made conductive. Further, the P-channel transistors 101 and 102 are turned in response to the control signal given to the control input terminal 153, and at the same time the P-channel transistors 151 and 152 are turned on in response to the control signal given to the control input terminal 154. As the P-channel transistors 101 and 102 have the driving capacity larger than that of the other transistors 151 and 152 connected in parallel thereto, respectively, the P-channel transistors 101 and 102 store more rapidly the charge associated with the capacitance 2C in the capacitor 129 up to its settling level.

Stored in the total capacitance 2C of the capacitors 117, 118, . . . , 119, 120 and 121 is the electric charge, 2C (Vain−Vinvt), corresponding to the difference in potential of the analog input voltage, Vain, from the threshold voltage, Vinvt, of the inverter 103. Subsequently, the P-channel transistors 101 and 102 are turned off with the control signal 153 and the offset of the charge due to switching noise is compensated for under the state of the P-channel transistors 151 and 152 being kept turned on.

Then, the P-channel transistors 151 and 152 are turned off with the control signal 154. As the P-channel transistors 151 and 152 are structured to have the driving capacity, or W/L ratio, larger than that of the other transistors 101 and 102 connected in parallel thereto, respectively, the switches can be turned off with switching noise controlled to its minimum level. Thereby, the inverters 103 and 104, when potential change occurs in the node 212, produce the signal OUT of the high "H" or low "L" level on the output 222. At this instance, difference in the threshold voltage, or offset potential difference, between the inverters 103 and 104 can be cancelled by the capacitor 129.

Further, in the following state, when the terminal B of the switch 107 is switched into its connecting state and at the same time the terminal B of the switch 125 also into its connecting state, the node 108 of the output terminal Y of the switch 107 transmits the full-scaled reference voltage VRH, while the nodes 110, 112, . . . , 114 and 116 of the output terminals Y of the remaining switches 109, 111, . . . , 113 and 115 all produce the zero-scaled reference voltage VRL. The electric charge 2C(Vain−Vinvt) stored in the total capacitance 2C is constant, and thus the split electric charge causes the potential of the node 212 to be ½ (VRH−VRL)−(Vain−Vinvt). The inverter 103 inverses the potential difference against the threshold voltage, Vinvt, to output the inverted result. The comparator 220 thus compares the input voltage, Vain, with the potential, ½ (VRH−VRL), to ultimately produce the signal OUT of the level "H" or "L" accordingly on the output terminal 222. Through that successive comparison operation, the binary value of the MSB position is determined, and the resultant value is transferred via the comparison result processor 230 to the output register 236, FIG. 2.

Then, the comparison result processor 230 generates, and supplies the comparison voltage generator 210 with, in response to the result from the comparison and determination of the MSB bit, the control signals for causing the switch 107 to connect its terminal A, and simultaneously the switch 109 to its terminal B with the remaining switches remaining as they are.

In a way similar to that described above, the potential on the node 212 becomes ¼(VRH−VRL)−(Vain−Vinvt) according to the weighted capacitance of each capacitor, and successive approximation operation is executed on the bit position immediately less significant than the MSB position to thereby develop the comparison result OUT on the output terminal 222. The comparison result is stored in the output register 236, and the control signal associated with the comparison result is produced by the comparison result processor 230 to control the switches of the reference signal generator 210.

In that way, the difference of the potential, $½^{(n+1)}$(VRH−VRL)−(Vain−Vinvt), from the threshold voltage, Vinvt, is determined for the MSB position to the LSB position in sequence, where i takes 0, 1, 2, . . . , n−1, n, in the instant example. Thus, the comparison result OUT are developed from the output 22 in sequence, whereby the output code of the n bits from the MSB position to the LSB position will be determined in order and established in the output register 236. When the output code of the MSB through LSB positions has been completed, the output register outputs its held value as the result from the analog-to-digital conversion on the n bits.

As have been described so far, according to the illustrative embodiment shown in FIG. 1, the successive approximation type analog-to-digital converter comprises a capacitance-ladder type of digital-to-analog converter, or a comparison voltage generating circuit, and a chopper comparator capable of eliminating offset errors and comparing an analog voltage with high accuracy. The embodiment controls the influence of switching noise by means of the P-channel transistors 101 and 102 each having larger driving capacity and connected to the control signal input terminal 153 to allow the electric charge of an input voltage to be stored in the internal sample holding capacitor 129 at a higher speed, and also by driving the P-channel transistors 151 and 152 each having smaller driving capacity to be turned off at varied control timing after the P-channel transistors 101 and 102 have been turned off.

Subsequently, referring to FIG. 6, description will be given for an alternative embodiment of the comparison voltage generator and the comparator built in the successive approximation type of analog-to-digital converter. The entire system of the alternative embodiment may be similar to that shown in FIG. 2. Also, the comparison voltage generator may be similar to the comparison voltage generator 210 in the embodiment shown in FIG. 1. The alternative embodiment may be the same as the FIG. 1 embodiment except that a comparator 600 connected to the node 212 of the comparison voltage generator 212 supplies the control signals to the gate of P-channel transistors 601 and 602 at predetermined timing. The basic configuration of the comparator 600 may be similar to the comparator 220.

Specifically, the comparator 600 comprises an inverter 603 having its input interconnected to the output note 212 of the comparison voltage generator 210, and P-channel transistors 601 and 651 having the drain thereof interconnected to the node 212. The inverter 603 has its output interconnected to the source electrode of the P-channel transistors 601 and 651 connected to one plate of a capacitor 629. The capacitor 629 has its other plate connected to the input of an inverter 604. The inverters 603 and 604 are adapted for inverting the respective inputs with respect to the threshold voltage, Vinvt, to output the resultant voltage. The input of the inverter 604 is further connected to the drain electrode of P-channel transistors 602 and 604. The inverter 604 has its output connected to the source electrode of the P-channel transistors 602 and 652. By means of the capacitive coupling, the capacitor 629 cancels the difference in threshold between the inverters 603 and 604. In this way, the P-channel transistors 601 and 651 are connected in parallel to the input and output terminals, respectively to form an inverter feedback switch, while the P-channel transistors 602 and 652 are connected in parallel to the input and output terminals of the inverter 603, respectively, to also form another inverter feedback switch. The output OUT of the inverter 604 forms the output 222 of the comparator 600.

Further, the P-channel transistor 601 has its gate electrode connected to a control signal input terminal 653. The P-channel transistor 602 has its gate electrode connected to a control signal input terminal 655. The P-channel transistors 651 and 652 have gate electrode thereof connected in common to a control signal input terminal 654. Timing waveforms of the control signals fed into the control input terminals 655, 653 and 654 are shown in FIG. 7. As shown in the figure, the control signal 653 of its high level first goes to its low level at time t1, behind which, the subsequent control signal 655 changes into its low level at time t2. Thereafter, the control signal 654 changes into its low level at time t3. The P-channel transistors 601 and 602, 651 and 652 turn on and off in response to those control signals 653 and 655 and 654. The control signals 655, 653 and 654 are fed, for example, from the control circuit 250 shown in FIG. 2.

The relationship of the driving capacity, W/L ratio, between the P-channel transistors of the alternative embodiment is set in such a fashion that the P-channel transistor 601 is larger than the P-channel transistor 602, which is larger than the P-channel transistor 651, which is larger than the P-channel transistor 652. For a ratio applicable to the different driving capacity of those transistors, the alternative embodiment may employ, for example "4:1" to "16:1", similarly to those in the illustrative embodiment shown in FIG. 1.

With the configuration described above, the operation will be described of the alternative embodiment of the comparison voltage generator 210 and the comparator 600 built in the successive approximation type of analog-to-digital converter 200.

To begin with, when the analog voltage, Vain, is applied to the analog input AIN of the comparison voltage generator 210, the changeover switch 123 and the changeover switches 107, 109, . . . , 111 and 113 connect their respective terminals A, while the switch 115 is turned on. Further, the P-channel transistors 601 and 602 get into the conductive state thereof, respectively, in response to the control signals fed on the control input terminals 653 and 655. At the same time, the P-channel transistors 651 and 652 are turned on in response to the control signal fed on the control input terminal 654. As the P-channel transistors 601 and 602 have the driving capacity larger than those of the remaining transistors connected in parallel thereto, the P-channel transistors 601 and 602 can store the electric charge associated with the total capacitance 2C in the capacitor 629 up to its settling level at a higher speed.

Stored in the total capacitance 2C of the capacitors 117, 118, . . . , 119, 120 and 121 is the electric charge, 2C (Vain−Vinvt), corresponding to the potential difference of the analog voltage, Vain, from the threshold voltage, Vinvt, of the inverter 603. Subsequently, the P-channel transistor 601 is turned off in response to the control signal 653, and the P-channel transistor 602 is turned off in response to the control signal 655 with timing delayed. At this instance, the P-channel transistors 651 and 652 are still maintained at the conductive state thereof, and the offset of the charges due to switching noise will accordingly be compensated for.

Then, the P-channel transistors 651 and 652 are turned off in response to the control signal 654. As the P-channel transistors 651 and 652 have the driving capacity, or W/L ratio, smaller than that of the remaining transistors connected in parallel thereto, the switches can be turned off with switching noise controlled to its minimum level. Thereby, the inverters 603 and 604, when a potential change occurs on the node 212, produce the signal OUT of "H" or "L" level on the output 222. At this instance, the potential difference, or offset potential difference, in the threshold voltage between the inverters 603 and 604 is cancelled.

Still further, when the terminal B of the switch 107 is connected, and at the same time the terminal B of the switch 123 is connected, the node 108 connected to the output terminal Y of the switch 107 reaches the full-scale reference voltage, VRL, while the nodes 110, 112, 114 and 116 connected to the output terminal Y of the switches 109, 111, 113 and 116 all reach the zero-scale reference voltage, VRL. The electric charge 2C(Vain−Vinvt) stored in the total capacitance 2C at this instance is constant, and the charge splitting renders the node 212 to the potential, ½ (VRH−VRL)−(Vain−Vinvt). Then, the inverter 103 inverts the potential difference from the threshold voltage, Vinvt, to output the inverted difference. The comparator 600 compares the input voltage, Vain, with the potential, ½ (VRH−VRL), to ultimately produce the signal OUT of the level "H" or "L" onto the output terminal 222. Through that successive comparison operation, the binary value of the MSB position is determined, and the resultant value is transferred via the comparison result processor 230 to the output register 236, FIG. 2, as with the illustrative embodiment shown in FIG. 1.

Thereafter, the comparison result processor 230 generates, and supplies the comparison voltage generator 210 with, in response to the result from the comparison and determination of the MSB bit, the control signals for causing the switch 107 to connect its terminal A and at the same time the switch 109 to connect its terminal B with the remaining switches 111 to 116 maintaining the current state as it is.

Subsequently, like the operation described above, the node 212 takes the potential equal to ¼(VRH−VRL)−(Vain−Vinvt) as the result of weighted capacitance of the capacitors. Successive approximation operation is executed to produce the comparison result OUT on the bit immediately less significant bit than the MSB bit on the output terminal 222. The comparison result is stored in the output register 236, and at the control signal corresponding to the comparison result is transferred from the comparison result processor 230 to control the switches of the comparison voltage generator 210.

In that way, the voltage comparison is made on the MSB position through the less significant positions toward the n-th bit position between the potential, $½^{(n+1)}$(VRH−VRL)−(Vain−Vinvt) and the threshold voltage, Vinvt, whereby the n bits of the MSB through LSB positions are determined and stored in sequence into the output register 236. When the output code of the n bits of the MSB through LSB positions are completed in the output register 236, the output register 236 develops the held value as the analog-to-digital conversion result of the n bits.

Figure 6:
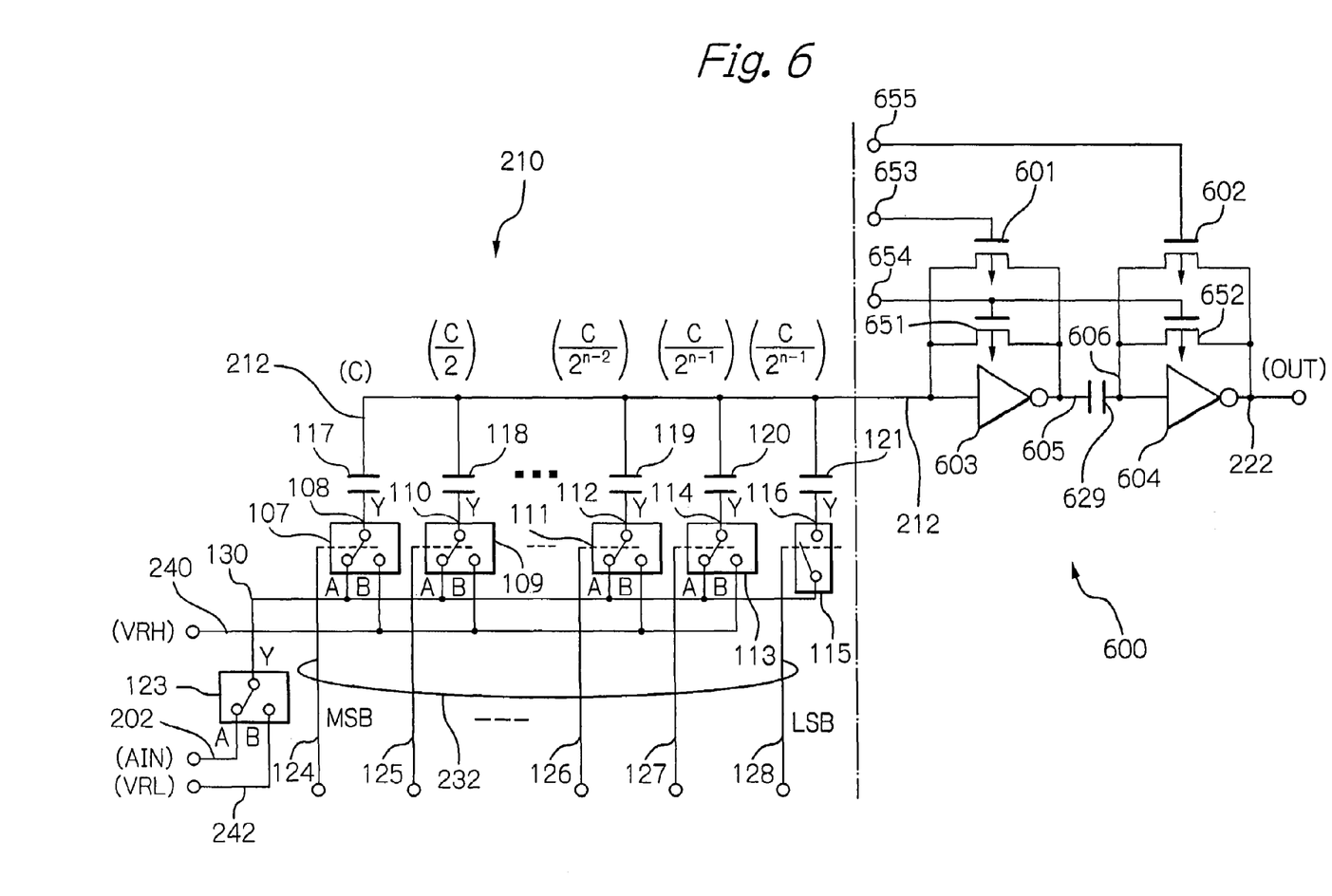
FIG. 6 is a schematic circuit diagram, like FIG. 1, showing an alternative embodiment of the comparison voltage generating circuit (D/A) and the comparator built in a successive approximation type of analog-to-digital converter.
Figure 7:
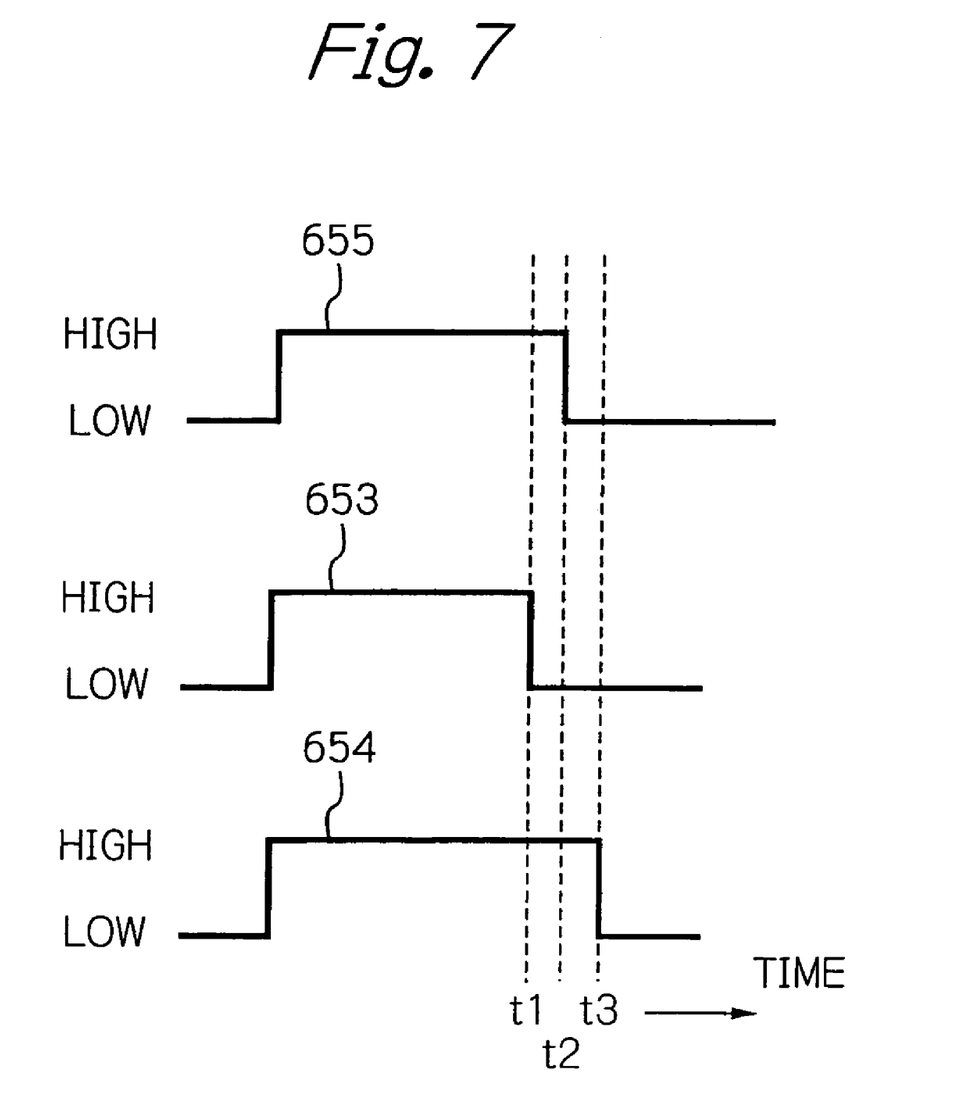
FIG. 7 is a timing chart, like FIG. 5, showing timing waveforms of control signals fed into the comparator shown in FIG. 6.

As described above, according to the alternative embodiment shown in FIG. 6, by means of the P-channel transistor 601 connected to the control signal input terminal 653 and having its larger driving capacity, or W/L ratio, and by means of the P-channel transistor 202 connected to the control signal input terminal 655, the electric charge associated with an input voltage can be stored in the internal sample and hold capacitor 629 at a higher speed. Further, the control timing is set so as to first turn the P-channel transistor 601 and successively turn the P-channel transistor 602 off, thereby the problem being suppressed with an offset which would otherwise temporarily be increased due to the simultaneous switching of the transistors.

Also, by turning off the P-channel transistors 651 and 652 each having the smaller driving capacity thereof at the different control timings like with the FIG. 1 embodiment and thereafter turning the P-channel transistors 601 and 602 off, an offset error, which is one of the causes to lower the gain, can be eliminated to further reduce the influence of switching noise. As the result, it is possible to provide an analog-to-digital converter capable of comparing an analog voltage with a higher accuracy and comprising a capacitance-ladder type of digital-to-analog converter, i.e. a comparison voltage generating circuit, and a chopper comparator.

As the capacitance of the capacitor 629 of the comparator 600 can be set to be smaller than the total capacitance of the capacitors 117–121 for sample and hold of the comparison voltage generator 210, the size of P-channel transistors 602 and 652 in the second stage can be fabricated smaller to further control switching noise and the semiconductor chip area can also be reduced.

Figure 8:
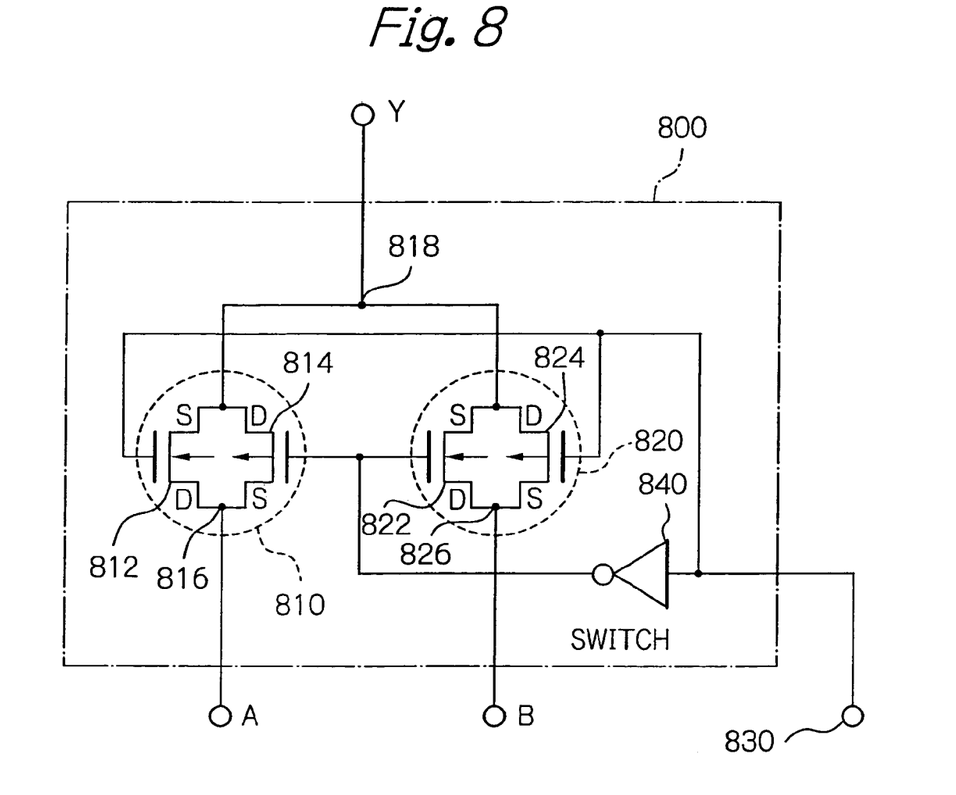
FIGS. 8 and 9 are schematic circuit diagrams showing embodiments of the switches arranged in the comparison voltage generating circuit.

In addition, the respective switches 107, 109, . . . , 111, 113 and 115 provided in the comparison voltage generator 210 of those embodiments shown in FIGS. 1 and 6 may be, for example, a switch circuit shown in FIG. 8. Additionally, the switch 115 may be, for example, a switch circuit shown in FIG. 9.

FIG. 8 shows a switch circuit 800 having a CMOS analog switch 810 connected to a control input terminal A, and another CMOS analog switch 820 connected to another control input terminal B. The CMOS analog switch 810 includes an N-channel transistor 812 and a P-channel transistor 814. The control input terminal A is connected to the drain electrode of the N-channel transistor 812 and the source electrode of the P-channel transistor 814 at a node 816. The N-channel transistor 812 has its source electrode connected to the drain electrode of the P-channel transistor 814 at a node 818, which in turn interconnected to the output terminal Y of the switch circuit 800.

Figure 9:
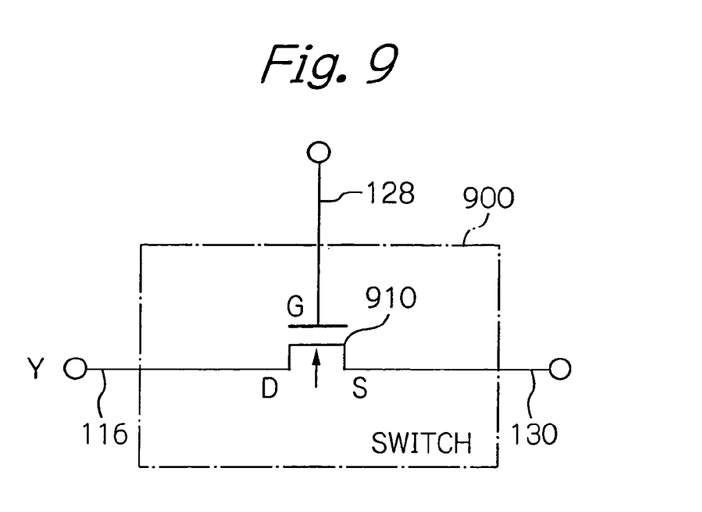

Further, the CMOS analog switch 820 includes an N-channel transistor 822 and a P-channel transistor 824. The control input terminal B is connected to the drain electrode of the N-channel transistor 822 and the source electrode of the P-channel transistor 824 at a node 826. The N-channel transistor 822 has its source electrode connected to the drain electrode of the P-channel transistor 824, and to the output terminal Y at the node 818. The N-channel transistor 812 and the P-channel transistor 824 has gate electrodes thereof connected to each other and further to a control input terminal 830. The control input terminal 830 is further connected to the gate electrode of the P-channel transistor 814 and the N-channel transistor 822 through an inverter 840. The switch 115 included in the illustrative embodiments shown in FIGS. 1 and 6 may be implemented by, for example, an NMOS switch circuit 900 comprising an N-channel transistor 910 as shown in FIG. 9.

Where the changeover switches 107–120 shown in FIGS. 1 and 6 are implemented by the circuit 800 shown in FIG. 8, the CMOS analog switch 820, i.e. the transistors 822 and 824 built therein, may be fabricated smaller in size by establishing the relationship described below. Specifically, the size of the CMOS analog switches forming the changeover switches 107–113 may be set to be smaller in this order in proportion to the capacitances, C, C/2, $C/2^2$, . . . , $C/2^{(n-2)}$, $C/2^{(n-1)}$, $C/2^{(n-2)}$, of the capacitors 117–120, respectively, to attain the relationship in size such that the switch 107 is larger than the switch 110, which is larger than the successive switch, which is larger than the switch 111, which is in turn smaller than the switch 113. In addition, the switches 113 and 115 may be of the same size.

With the configuration described above, the size of the CMOS analog switches for use in the changeover switches may be designed to be smaller in the order in proportion to the capacitances, C, C/2, $C/2^2$, . . . , $C/2^{(n-2)}$, $C/2^{(n-1)}$, $C/2^{(n-2)}$), whereby the semiconductor circuit chip size can be reduced and the influence of the switching noise can be controlled.

As have been described so far, the comparator circuits 220 and 600 of the embodiments include switches implemented by P-channel transistors. They may also be implemented by N-channel type transistors or CMOS analog switches with the threshold voltage of its inverter adjusted accordingly. Further, the comparator circuits 210 and 600 of the embodiments have a two-stage structure capable of canceling the capacitive-coupling offset. It is however not confined thereto, but a three-staged or a four-staged configuration can also be formed to increase the gain. Still further, the embodiments are implemented by the capacitance-weighted, capacitive-ladder type of digital-to-analog converter, or a comparison voltage generator, and comparator. The invention is also advantageously applicable to a control system for a chopper comparator.

The entire disclosure of Japanese patent application No. 2004-109077 filed on Apr. 1, 2004, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A successive approximation analog-to-digital converter comprising a comparator for sequentially comparing an analog input voltage with a comparison voltage to generate a comparison result, wherein said comparator comprises:
   a first inverter for receiving the analog input voltage and the comparison voltage in sequence;
   a capacitor having one plate connected to said first inverter to store an electric charge;
   a second inverter connected to another plate of said capacitor;
   a first feedback switch connected in parallel to an input and an output terminal of said first inverter; and
   a second feedback switch connected in parallel to an input and an output terminal of said second inverter,
   said first feedback switch including first and second transistors connected in parallel to each other to the input and output terminals of said first inverter, said first transistor being formed to have a driving capacity larger than that of said second transistor,
   said second feedback switch including third and fourth transistors connected in parallel to each other to the input and output terminals of said second inverter, said third transistor being formed to have a driving capacity larger than that of said fourth transistor,
   said first and third transistors having respective gate electrodes connected to each other and further connected to a first control input terminal for receiving a first control signal, said second and fourth transistors having respective gate electrodes connected to each other and further connected to a second control input terminal for receiving a second control signal, in successive approximation operation, said first and third transistors being controlled differently in timing of switching between conductive and non-conductive states from said second and fourth transistors to compare the analog input voltage with the comparison voltage.

2. The analog-to-digital converter as defined in claim 1, wherein said first and third transistors are switched from the conductive state to the non-conductive state, and thereafter said second and fourth transistors are switched from the conductive state to the non-conductive state.

3. The analog-to-digital converter as defined in claim 1, wherein said first and third transistors have respective gate electrodes having a ratio of a width to a length larger than a ratio of a width to a length of a gate electrode of said second and fourth transistors, respectively, to thereby establish a difference in driving capacity between said first and second transistors and between said third and fourth transistors.

4. The analog-to-digital converter as defined in claim 1, wherein said converter is formed in a CMOS (Complementary Metal-Oxide-Semiconductor) circuit.

5. The analog-to-digital converter as defined in claim 1, further comprising a comparison voltage generator, said comparison voltage generator comprising:

a plurality of switches for sampling the analog input voltage and a reference voltage according to the comparison voltage; and a plurality of capacitors, each having one plate connected to an output of corresponding one of said plurality of switches, for holding the reference voltage and the comparison voltage in sequence, said plurality of capacitors having respective capacitances weighted in a way that the capacitances are smaller in order from an MSB position to an LSB position, said plurality of capacitors each having another plate connected in common to form an output of the comparison voltage from said comparison voltage generator, said plurality of switches having respective switch sizes smaller in order from the MSB position to the LSM position in proportion to the capacitances of said plurality of capacitors.

6. A successive approximation analog-to-digital converter comprising a comparator for sequentially comparing an analog input voltage with a comparison voltage to generate a comparison result, wherein said comparator comprises:

a first inverter for receiving the analog input voltage and the comparison voltage in sequence;

a capacitor having one plate connected to said first inverter to store an electric charge;

a second inverter connected to another plate of said capacitor;

a first feedback switch connected in parallel to an input and an output terminal of said first inverter; and a second feedback switch connected in parallel to an input and an output terminal of said second inverter, said first feedback switch including first and second transistors connected in parallel to each other to the input and output terminals of said first inverter, said first transistor being formed to have a driving capacity larger than that of said second transistor, said second feedback switch including third and fourth transistors connected in parallel to each other to the input and output terminals of said second inverter, said third transistor being formed to have a driving capacity larger than that of said fourth transistor, said first transistor having a gate electrodes connected to a first control input terminal for receiving a first control signal, said third transistor having a gate electrode connected to a second control input terminal for receiving a second control signal, said second and fourth transistors having respective gate electrodes connected to each other and further connected to a third control input terminal for receiving a third control signal, in successive approximation operation, said first and third transistors being controlled differently in timing of switching between conductive and non-conductive states from said second and fourth transistors, said first and third transistors being controlled differently in timing of switching between conductive and non-conductive states from each other, to compare the analog input voltage with the comparison voltage.

7. The analog-to-digital converter as defined in claim 6, wherein said first transistor is switched from the conductive state to the non-conductive state, and thereafter said third transistor is switched from the conductive state to the non-conductive state, and thereafter said second and fourth transistors are switched from the conductive state to the non-conductive state.

8. The analog-to-digital converter as defined in claim 6, wherein said first and third transistors have respective gate electrodes having a ratio of a width to a length larger than a ratio of a width to a length of a gate electrode of said second and fourth transistors, respectively, to thereby establish a difference in driving capacity between said first and second transistors and between said third and fourth transistors.

9. The analog-to-digital converter as defined in claim 6, wherein said converter is formed in a CMOS (Complementary Metal-Oxide-Semiconductor) circuit.

10. The analog-to-digital converter as defined in claim 6, further comprising a comparison voltage generator, said comparison voltage generator comprising:

a plurality of switches for sampling the analog input voltage and a reference voltage according to the comparison voltage; and a plurality of capacitors, each having one plate connected to an output of corresponding one of said plurality of switches, for holding the reference voltage and the comparison voltage in sequence, said plurality of capacitors having respective capacitances weighted in a way that the capacitances are smaller in order from an MSB position to an LSB position, said plurality of capacitors each having another plate connected in common to form an output of the comparison voltage from said comparison voltage generator, said plurality of switches having respective switch sizes smaller in order from the MSB position to the LSM position in proportion to the capacitances of said plurality of capacitors.

11. A comparator for sequentially comparing an analog input voltage with a comparison voltage, comprising:

a first inverter for receiving the analog input voltage and the comparison voltage in sequence;

a capacitor having one plate connected to an output terminal of said first inverter to store an electric charge;

a second inverter connected to another plate of said capacitor;

a first feedback switch connected in parallel to an input and an output terminal of said first inverter; and a second feedback switch connected in parallel to an input and an output terminal of said second inverter, said first feedback switch including first and second transistors connected in parallel to each other to the input and output terminals of said first inverter, said first transistor being formed to have a driving capacity larger than that of said second transistor, said second feedback switch including third and fourth transistors connected in parallel to each other to the input and output terminals of said second inverter, said third transistor being formed to have a driving capacity larger than that of said fourth transistor, said first and third transistors having respective gate electrodes connected to each other and further connected to a first control input terminal for receiving a first control signal, said second and fourth transistors having respective gate electrodes connected to each other and further connected to a second control input terminal for receiving a second control signal, in successive approximation operation, said first and third transistors being controlled differently in timing of switching between conductive and non-conductive states from said second and fourth transistors to compare the analog input voltage with the comparison voltage.

12. A comparator for sequentially comparing an analog input voltage with a comparison voltage, comprising:

a first inverter for receiving the analog input voltage and the comparison in sequence;

a capacitor having one plate connected to an output terminal of said first inverter to store an electric charge;

a second inverter connected to another plate of said capacitor;

a first feedback switch connected in parallel to an input and an output terminal of said first inverter; and a second feedback switch connected in parallel to an input and an output terminal of said second inverter, said first feedback switch including first and second transistors connected in parallel to each other to the input and output terminals of said first inverter, said first transistor being formed to have a driving capacity larger than that of said second transistor, said second feedback switch including third and fourth transistors connected in parallel to each other to the input and output terminals of said second inverter, said third transistor being formed to have a driving capacity larger than that of said fourth transistor, said first transistor having a gate electrode connected to a first control input terminal for receiving a first control signal, said third transistor having a gate electrode connected to a second control input terminal for receiving a second control signal, said second and fourth transistors having respective gate electrodes connected to each other and further connected to a third control input terminal for receiving a third control signal, in successive approximation operation, said first and third transistors being controlled differently in timing of switching between conductive and non-conductive states from said second and fourth transistors, said first and third transistors being controlled differently in timing of switching between conductive and non-conductive states from each other, to compare the analog input voltage with the comparison voltage.

* * * * *